United States Patent
Yeh et al.

(10) Patent No.: US 9,442,532 B2
(45) Date of Patent: Sep. 13, 2016

(54) PORTABLE ELECTRONIC DEVICE AND COVER MECHANISM THEREOF

(71) Applicant: Wistron Corporation, New Taipei (TW)

(72) Inventors: Ping-Sheng Yeh, New Taipei (TW); Cheng-Tang Chang, New Taipei (TW); Shin-Yi Hsieh, New Taipei (TW)

(73) Assignee: Wistron Corporation, New Taipei (TW)

(*) Notice: Subject to any disclaimer, the term of this patent is extended or adjusted under 35 U.S.C. 154(b) by 0 days.

(21) Appl. No.: 14/741,474

(22) Filed: Jun. 17, 2015

(65) Prior Publication Data

US 2016/0077554 A1    Mar. 17, 2016

(30) Foreign Application Priority Data

Sep. 11, 2014  (TW) .............................. 103131419 A

(51) Int. Cl.
  *H04M 1/00*    (2006.01)
  *G06F 1/16*    (2006.01)
  *H05K 5/02*    (2006.01)

(52) U.S. Cl.
  CPC ........... *G06F 1/1656* (2013.01); *G06F 1/1626* (2013.01); *H05K 5/0226* (2013.01)

(58) Field of Classification Search
  CPC ... H04B 1/3888; H04B 1/3833; H04M 1/18; H04M 1/0214; H04M 1/23; H04M 1/0237; G06F 1/1616; G06F 1/1656; G06F 1/1632; G06F 1/1679; G06F 1/1635; G06F 1/1626
  USPC ...... 455/90.3, 550.1, 575.1, 575.8; 361/679.01, 679.02, 679.55, 679.56, 361/679.58, 725
  See application file for complete search history.

(56) References Cited

U.S. PATENT DOCUMENTS

| 5,594,523 | A | 1/1997 | Fujisaki | |
|---|---|---|---|---|
| 6,411,504 | B2* | 6/2002 | Howell | 361/679.58 |
| 7,324,092 | B2* | 1/2008 | Lin | G06F 1/1616 |
| | | | | 16/221 |

(Continued)

FOREIGN PATENT DOCUMENTS

| TW | 201011434 | 3/2010 |
|---|---|---|
| TW | M444548 | 1/2013 |

OTHER PUBLICATIONS

Office action mailed on Sep. 25, 2015 for the Taiwan application No. 103131419, filing date: Sep. 11, 2014, p. 2 line 2-26, p. 3-7 and p. 8 line 1-3.

*Primary Examiner* — Nhan Le
(74) *Attorney, Agent, or Firm* — Winston Hsu; Scott Margo

(57) ABSTRACT

A portable electronic device includes a main body having an optical device, a cover, a bezel, and a cover mechanism including a rod, a driving handle movably disposed on the bezel, and a rotating member. The bezel has an opening for exposing the optical device and is connected to the cover for containing the main body. The rod has a covering portion and a first linkage portion and is pivoted to the bezel. The rotating member is rotatably disposed between the bezel and the cover and has a second linkage portion. The first and second linkage portions are movably connected to the driving handle. When the rotating member rotates, the second linkage portion drives the driving handle to drive the rod to rotate via the first linkage portion, so as to make the covering portion move to cover or not cover the opening.

20 Claims, 9 Drawing Sheets

(56) References Cited

U.S. PATENT DOCUMENTS 7,933,123 B2 * 4/2011 Wang .................... G06F 1/1626
  361/679.55
8,861,197 B2 * 10/2014 Tsai ..................... G06F 1/1681
  349/58
8,958,206 B2 * 2/2015 French, Jr. ................ G06F 1/16
  165/104.26

* cited by examiner

PORTABLE ELECTRONIC DEVICE AND COVER MECHANISM THEREOF

BACKGROUND OF THE INVENTION

1. Field of the Invention

The present invention relates to a portable electronic device and a cover mechanism thereof, and more specifically, to a portable electronic device disposing a rotating member between a bezel and a cover for rotatably driving a rod via a driving handle to selectively cover an opening and a cover mechanism thereof.

2. Description of the Prior Art

In general, a portable electronic device (e.g. a tablet computer) usually has an optical device (e.g. a micro projection device or a 3D camera device) disposed thereon for performing image processing operations (e.g. an image projection operation or an image capturing operation) of the portable electronic device. In the prior art, when the optical device is not used, the portable electronic device usually has a cover mechanism disposed thereon for preventing a user from viewing the optical device via an opening on a bezel of the portable electronic device. A common covering design is to dispose a covering sheet having a push button formed thereon on the bezel to be movable transversely relative to the bezel, for allowing that the user could push or pull the push button to selectively move the covering sheet to cover or not cover the opening. However, since the aforesaid design is to dispose the covering sheet on a front side of the bezel and to make the push button protrude from the bezel so that the user could push or pull the covering sheet conveniently, it could spoil the structural integrity of the bezel and limit the bezel structural design of the portable electronic device. Furthermore, since the user could view the push button clearly when operating the portable electronic device, the aforesaid design could also influence the user experience for the outer appearance of the portable electronic device.

SUMMARY OF THE INVENTION

The present invention provides a portable electronic device including a main body, a cover, a bezel, and a cover mechanism. The main body has at least one optical device. The cover covers the main body. The bezel has at least one opening for exposing the at least one optical device. The bezel is connected to the cover for containing the main body cooperatively with the cover. The cover mechanism includes at least one rod, a driving handle, and a rotating member. The at least one rod has a covering portion and a first linkage portion and is pivoted to the bezel for making the covering portion movable between a covering position and an open position relative to the bezel. The driving handle is movably disposed on the bezel. The first linkage portion is movably connected to the driving handle. The rotating member is rotatably disposed between the bezel and the cover and has a second linkage portion. The second linkage portion is movably connected to the driving handle. When the rotating member rotates, the second linkage portion drives the driving handle to drive the at least one rod to rotate via the first linkage portion, so as to make the covering portion move to the covering position with rotation of the at least one rod to cover the at least one opening, or move to the open position with rotation of the at least one rod to not cover the at least one opening.

The present invention further provides a cover mechanism for selectively covering at least one opening of a portable electronic device. The portable electronic device includes a cover, a bezel, and at least one optical device. The bezel has the at least one opening for exposing the at least one optical device. The bezel is connected to the cover and contains the at least one optical device. The cover mechanism includes at least one rod, a driving handle, and a rotating member. The at least one rod has a covering portion and a first linkage portion and is pivoted to the bezel for making the covering portion movable between a covering position and an open position relative to the bezel. The driving handle is movably disposed on the bezel. The first linkage portion is movably connected to the driving handle. The rotating member is rotatably disposed between the bezel and the cover and has a second linkage portion. The second linkage portion is movably connected to the driving handle. When the rotating member rotates, the second linkage portion drives the driving handle to drive the at least one rod to rotate via the first linkage portion, so as to make the covering portion move to the covering position with rotation of the at least one rod to cover the at least one opening, or move to the open position with rotation of the at least one rod to not cover the at least one opening.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
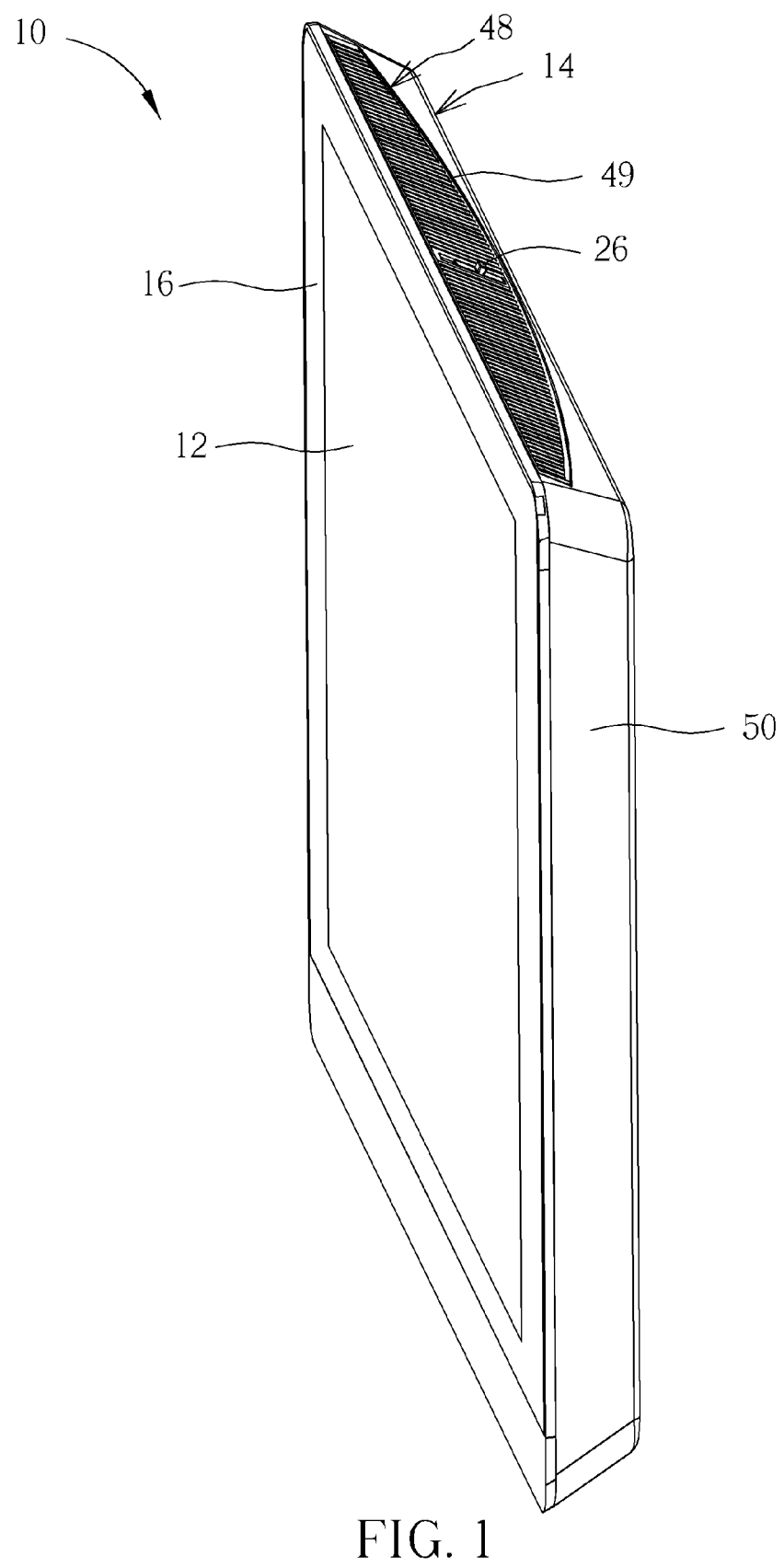
FIG. 1 is a diagram of a portable electronic device according to a first embodiment of the present invention.
Figure 2:
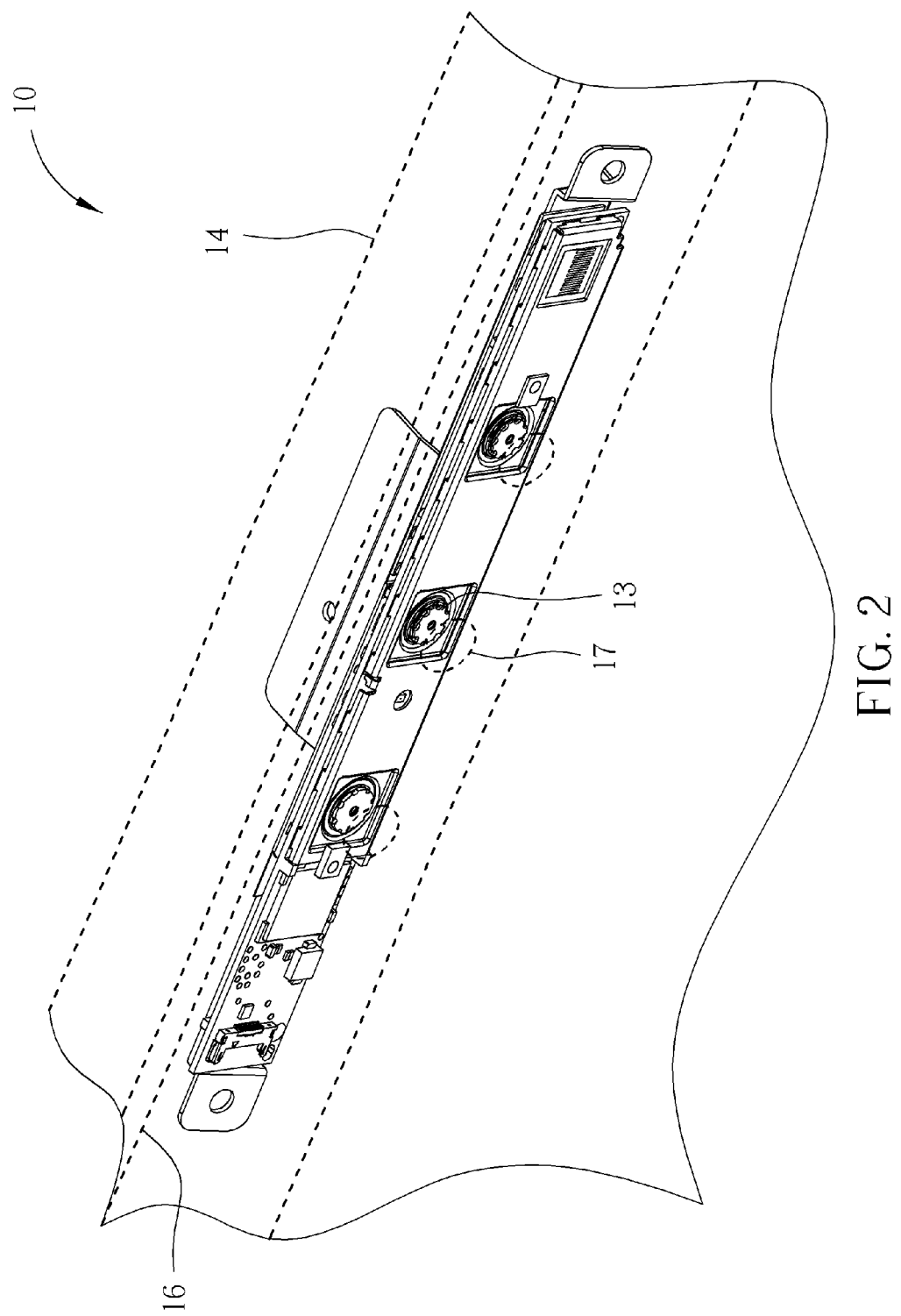
FIG. 2 is a partial internal diagram of the portable electronic device in FIG. 1.

Please refer to FIG. 1 and FIG. 2. FIG. 1 is a diagram of a portable electronic device 10 according to a first embodiment of the present invention. FIG. 2 is a partial internal diagram of the portable electronic device 10 in FIG. 1. As shown in FIG. 1 and FIG. 2, the portable electronic device 10 includes a main body 12, a cover 14, and a bezel 16. The cover 14 covers the main body 12. The bezel 16 is connected to the cover 14 and contains the main body 12 cooperatively with the cover 14. The main body 12 could include major components commonly disposed in a portable electronic device (e.g. a tablet computer), such as a display monitor and a main board, and the related description is omitted herein since it is commonly seen in the prior art. The main body 12 could have at least one optical device 13 (three shown in FIG. 2, but not limited thereto). The optical device 13 could preferably be an image processing device, such as a micro projection device or a 3D camera device. The bezel 16 could have at least one opening 17 (three shown in FIG. 2, but not limited thereto) for exposing the corresponding optical device 13, so that the related operations of the optical device 13 (e.g. an image projection operation or an image capturing operation) could be performed accordingly. To be noted, in FIG. 2, the cover 14 and the bezel 16 are depicted by dotted lines and the portable electronic device 10 only has the optical device 13 depicted therein for clearly showing the position relationship between the optical device 13 and the corresponding opening 17.

Figure 3:
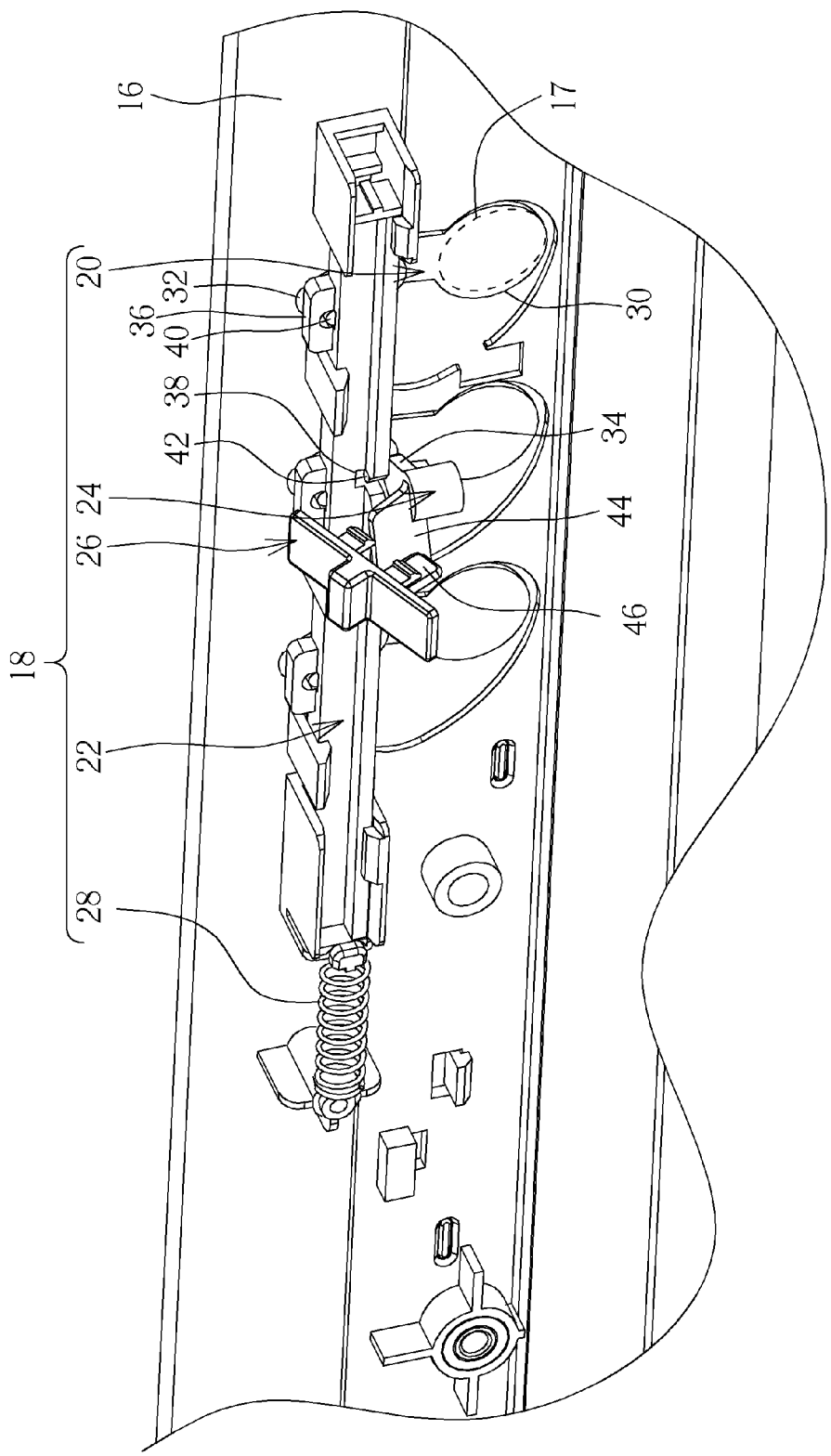
FIG. 3 is an enlarged diagram of a bezel in FIG. 1 having a cover mechanism disposed thereon.
Figure 4:
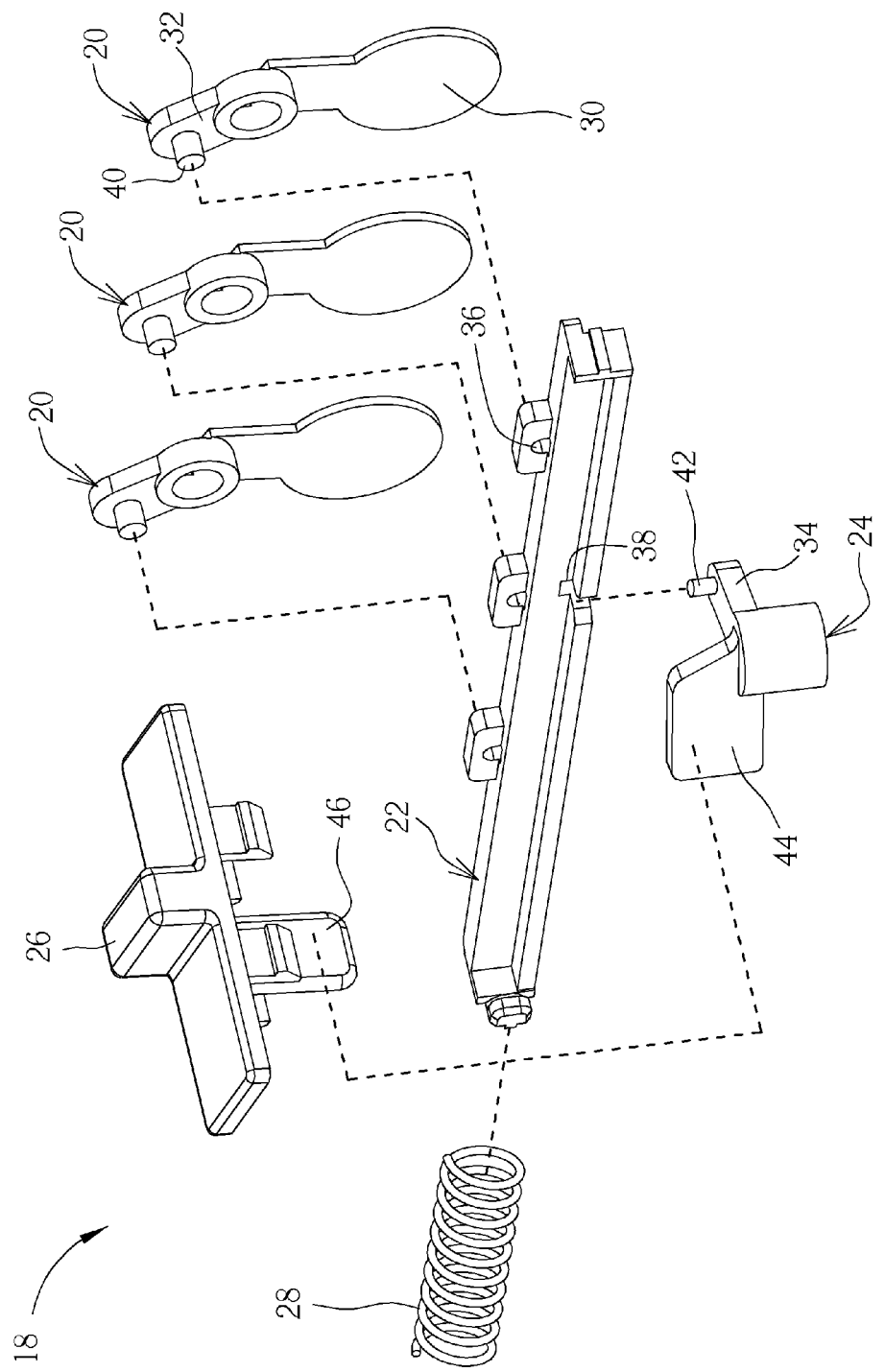
FIG. 4 is an exploded diagram of the cover mechanism in FIG. 3.

Please refer to FIG. 3 and FIG. 4. FIG. 3 is an enlarged diagram of the bezel 16 in FIG. 1 having a cover mechanism 18 disposed thereon. FIG. 4 is an exploded diagram of the cover mechanism 18 in FIG. 3. As shown in FIG. 3 and FIG. 4, the portable electronic device 10 further includes the cover mechanism 18. The cover mechanism 18 is disposed on the bezel 16 corresponding to the opening 17 for selectively covering the opening 17. The cover mechanism 18 includes at least one rod 20 (three shown in FIG. 4, but not limited thereto), a driving handle 22, a rotating member 24, a push button 26, and a spring 28. The rod 20 is preferably in a bent shape, but not limited thereto. For example, the rod 20 could also in a long strip shape in another embodiment of the present invention. In this embodiment, the rod 20 in a bent shape has a covering portion 30 and a first linkage portion 32 and is pivoted to the bezel 16, so as to make the covering portion 30 movable relative to the bezel 16. The driving handle 22 is movably disposed on the bezel 16. The first linkage portion 32 is movably connected to the driving handle 22. The rotating member 24 is rotatably disposed between the bezel 16 and the cover 14. For example, the rotating member 24 could be pivoted to a frame of the bezel 16 which is used for fixing the optical device 13. The rotating member 24 has a second linkage portion 34. The second linkage portion 34 is movably connected to the driving handle 22. To be more specific, in this embodiment, a slot portion 36 and a slot portion 38 are formed on the driving handle 22 corresponding to the first linkage portion 32 and the second linkage portion 34 respectively. A protruding pillar 40 extends from the first linkage portion 32 toward the slot portion 36. The protruding pillar 40 is movably disposed through the slot portion 36 to make the first linkage portion 32 move with the driving handle 22. A protruding pillar 42 extends from the second linkage portion 34 toward the slot portion 38. The protruding pillar 42 is movably disposed through the slot portion 38 to make the second linkage portion 34 drive the driving handle 22 to move with rotation of the rotating member 24.

To be noted, the linkage design for the driving handle 22, the first linkage portion 32 and the second linkage portion 34 is not limited to the aforesaid embodiment, meaning that the present invention could also adopt other linkage design for driving the first linkage portion 32 via linkage between the second linkage portion 34 and the driving handle 22. For example, the driving handle 22 could have a protruding pillar corresponding to the first linkage portion 32 and a protruding pillar corresponding to the second linkage portion 34. The protruding pillars of the driving handle 22 are movably disposed through a slot portion of the first linkage portion 32 and a slot portion of the second linkage portion 34 respectively, so that the second linkage portion 34 could drive the driving handle 22 to move with rotation of the rotating member 24 and the first linkage portion 32 could move with the driving handle 22.

Furthermore, as shown in FIG. 3 and FIG. 4, the rotating member 24 further has an abutting portion 44. The push button 26 is slidably disposed on the cover 14 and has a protruding portion 46 formed toward the abutting portion 44. The protruding portion 46 abuts against the abutting portion 44. Accordingly, when the push button 26 slides on the cover 14, the protruding portion 46 could push the abutting portion 44 to make the rotating member 24 rotate with movement of the push button 26. Furthermore, as shown in FIG. 3, the spring 28 is connected to the bezel 16 and the driving handle 22 for providing elastic force, so as to drive the driving handle 22 to move relative to the bezel 16 back to a position where the covering member 30 moves to the covering position as shown in FIG. 3 with rotation of the rod 20 to cover the opening 17.

In practical application, as shown in FIG. 1, the cover 14 could have an inclined top surface portion 48 and a casing portion 50. A plurality of heat dissipating holes 49 is formed on the inclined top surface portion 48 for heat dissipation. The inclined top surface portion 48 is connected to the casing portion 50 for covering the main body 12 cooperatively with the casing portion 50. The push button 26 is slidably disposed on the inclined top surface portion 48, so as to prevent the push button 26 from being viewed by a user when the user operates the portable electronic device 10. In such a manner, the aforesaid design could solve the prior art problem that disposal of the push button could influence the user experience for the outer appearance of the portable electronic device. As for other derived design for disposing the push button 26 on the cover 14 (e.g. the push button 26 could be disposed on a back side of the cover 14), it could be reasoned by analogy according to the aforesaid embodiment and the related description is omitted herein.

Figure 5:
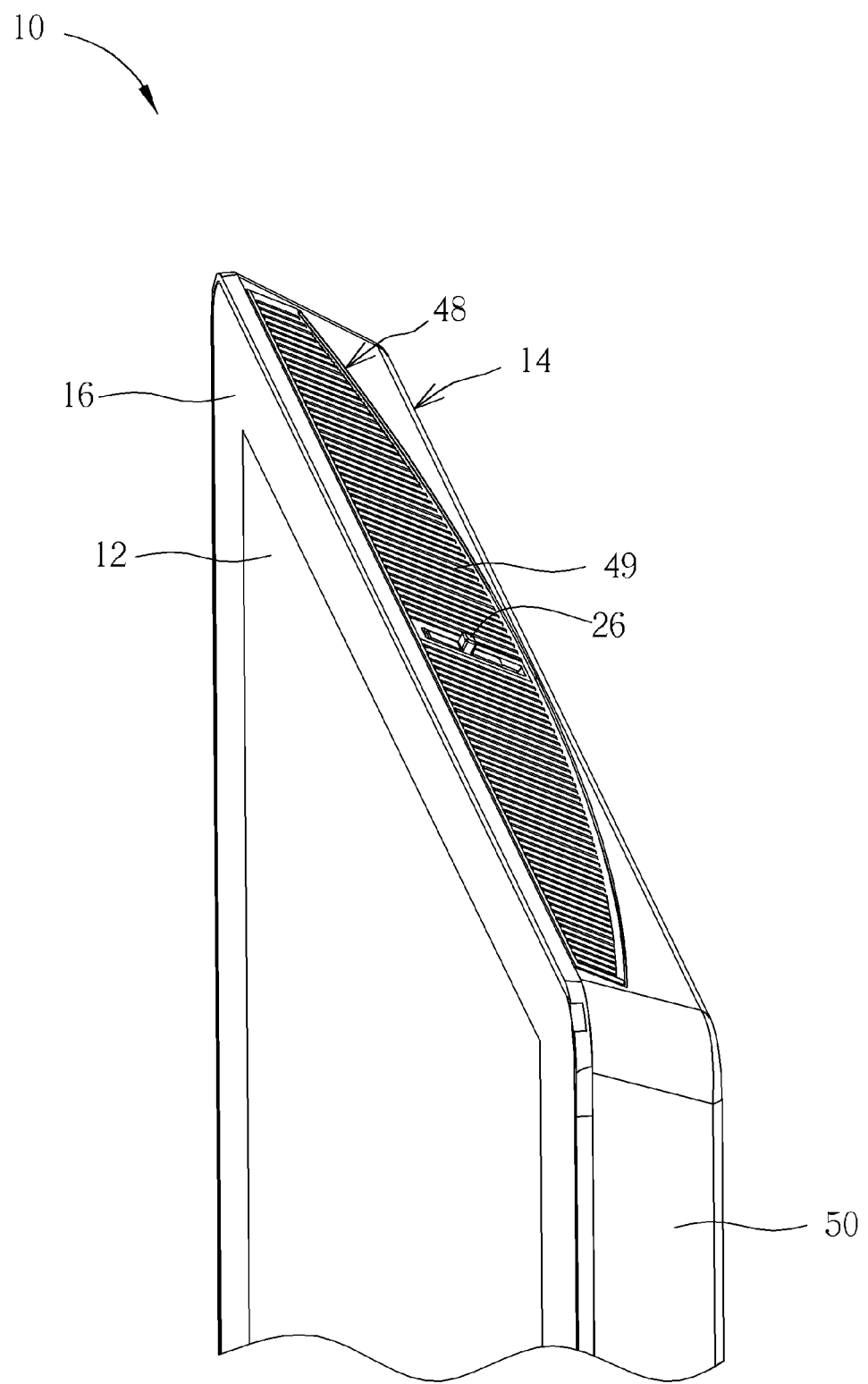
FIG. 5 is a diagram of a push button in FIG. 1 moving on the bezel in an obliquely upward direction.
Figure 6:
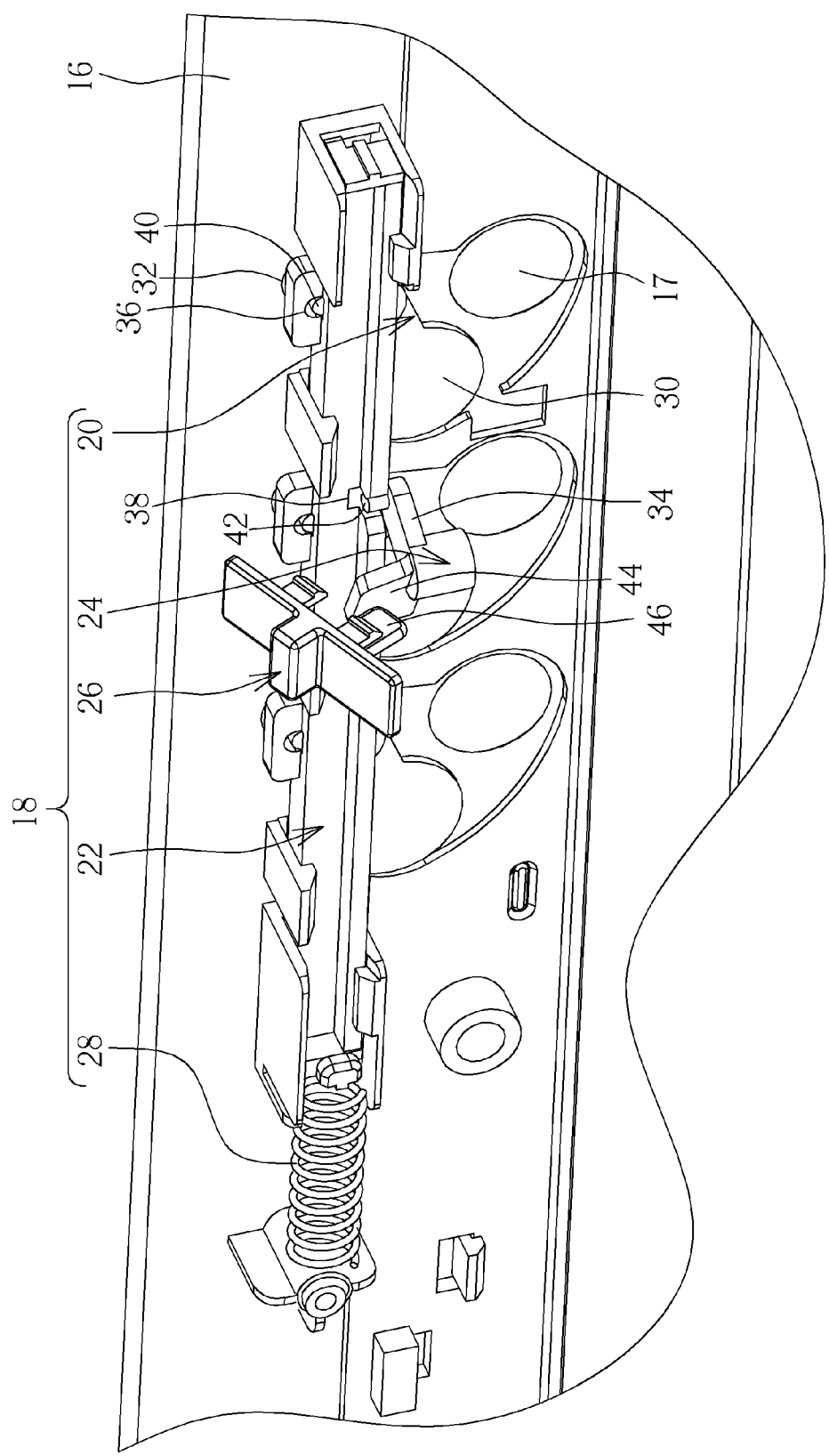
FIG. 6 is an enlarged diagram of a covering portion of a rod in FIG. 3 moving to an open position relative to the bezel.

More detailed description for the covering operation and the open operation of the cover mechanism 18 is provided as follows. Please refer to FIG. 1, FIG. 3, FIG. 5, and FIG. 6. FIG. 5 is a diagram of the push button 26 in FIG. 1 moving on the bezel 16 in an obliquely upward direction. FIG. 6 is an enlarged diagram of the covering portion 30 of the rod 20 in FIG. 3 moving to the open position relative to the bezel 16. When the user wants to use the optical device 13 of the portable electronic device 10, the user just needs to push the push button 26 from a position as shown in FIG. 1 to a position as shown in FIG. 5. During the aforesaid process, the protruding portion 46 could push the abutting portion 44 of the rotating member 24 with movement of the push button 26, so as to make the rotating member 24 rotate from a position as shown in FIG. 3 to a position as shown in FIG. 6 relative to the bezel 16. At the same time, via linkage between the protruding pillar 42 and the slot portion 38, the second linkage portion 34 could push the driving handle 22 to move from a position as shown in FIG. 3 to a position as shown in FIG. 6 with rotation of the rotating member 24 (at this time, the spring 28 is in a stretched state). In such a manner, via linkage between the protruding pillar 40 and the slot portion 36, the driving handle 22 could drive the rod 20 to rotate via the first linkage portion 32, so as to make the covering portion 30 move from the covering position covering the opening 17 as shown in FIG. 3 to the open position not covering the opening 17 as shown in FIG. 6. Accordingly, the related operations (e.g. an image projection operation or an image capturing operation) of the optical device 13 could be performed.

On the other hand, when the user does not need to use the optical device 13, the spring 28 in the stretched state as shown in FIG. 6 could drive the driving handle 22 from the position as shown in FIG. 6 back to the position as shown in FIG. 3. During the aforesaid process, via linkage between the protruding pillar 40 and the slot portion 36 and linkage between the protruding pillar 42 and the slot portion 38, the driving handle 22 could rotate the rod 20 via the first linkage portion 32 to make the covering portion 30 move from the open position as shown in FIG. 6 back to the covering position as shown in FIG. 3 for hiding the optical device 13. Furthermore, the driving handle 22 could also rotate the rotating member 24 via the second linkage portion 34, so as to make the push button 26 move from the position as shown in FIG. 5 back to the position as shown in FIG. 1 via linkage between the abutting portion 44 and the protruding portion 46. Accordingly, via the aforesaid button returning design, the user could perform the next button push operation conveniently.

Figure 7:
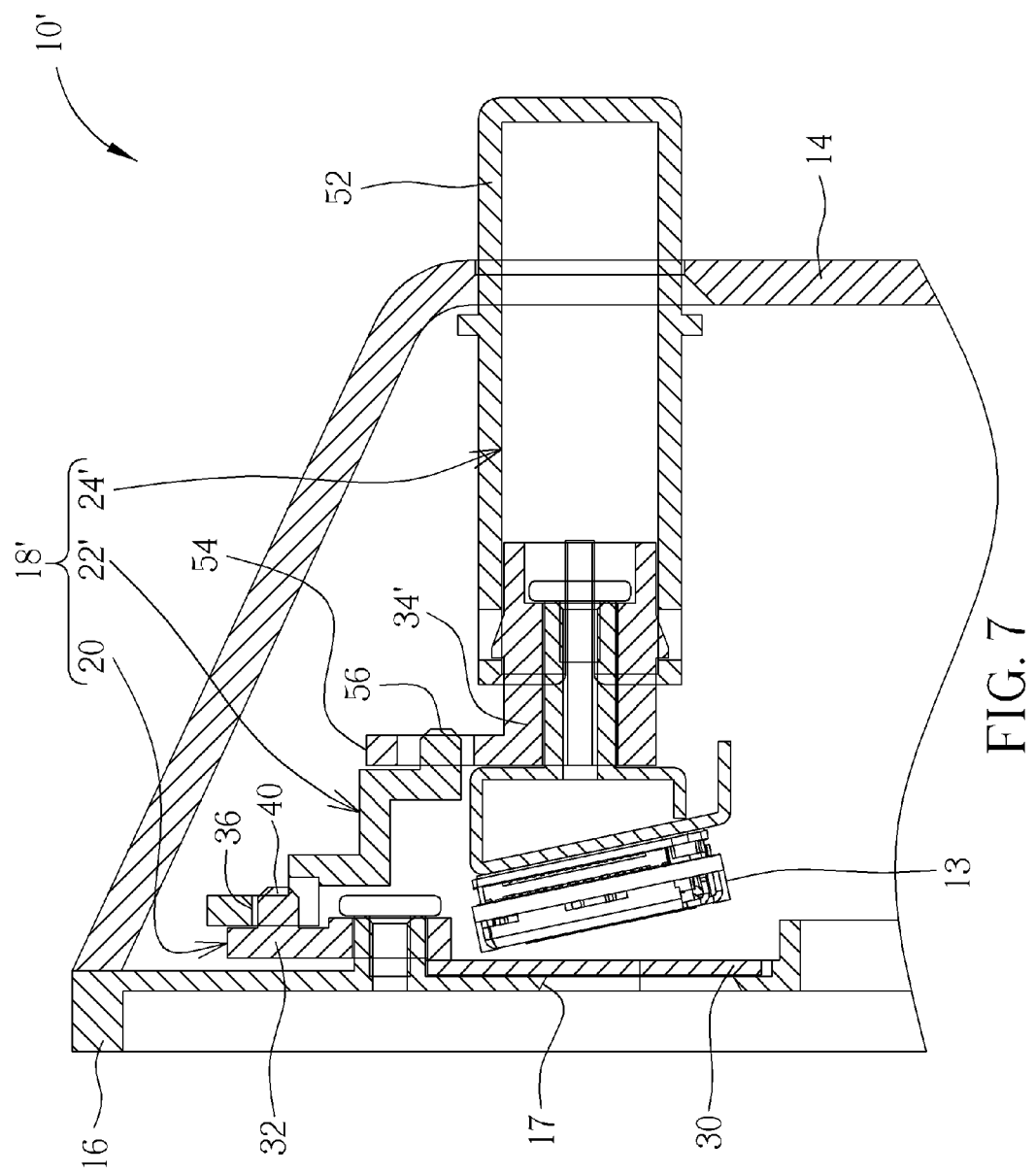
FIG. 7 is a partial sectional diagram of a portable electronic device according to a second embodiment of the present invention.
Figure 8:
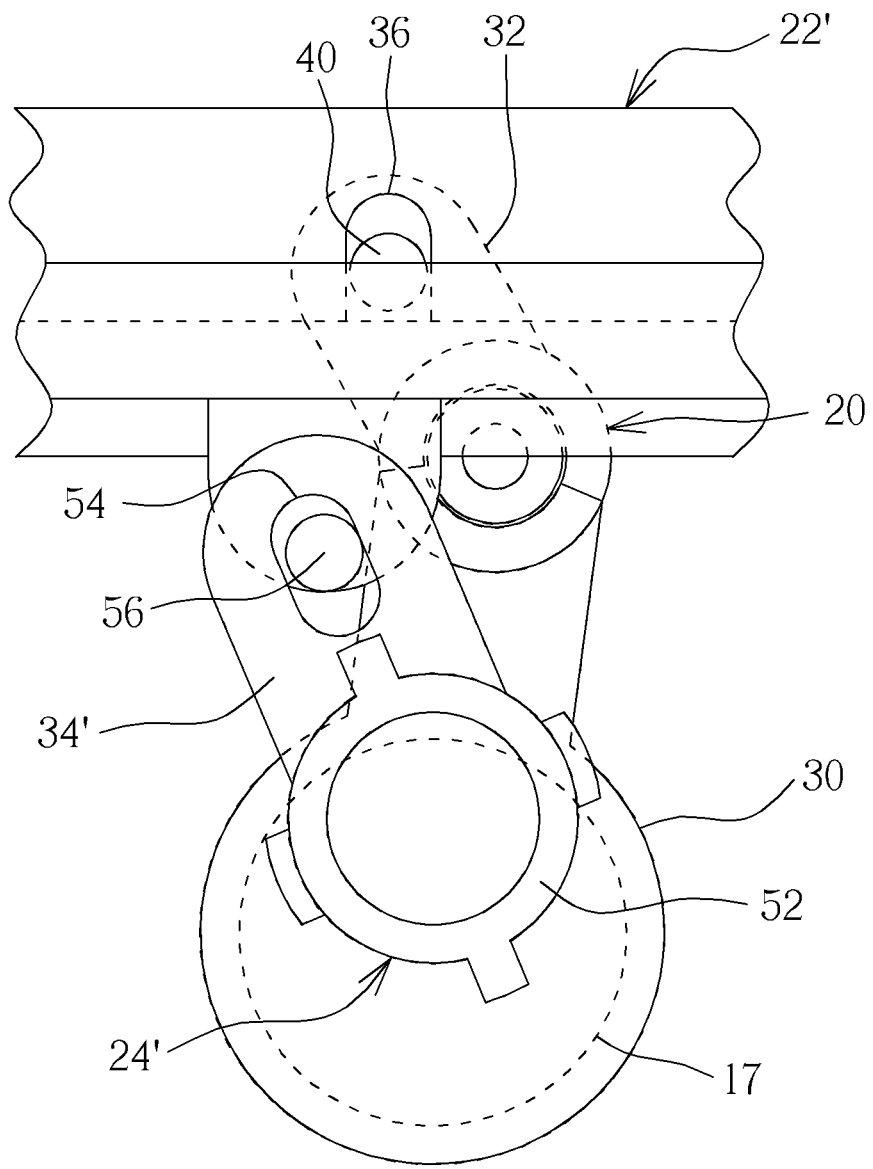
FIG. 8 is an enlarged diagram of the rod in FIG. 7 rotating to make the covering portion cover the opening.
Figure 9:
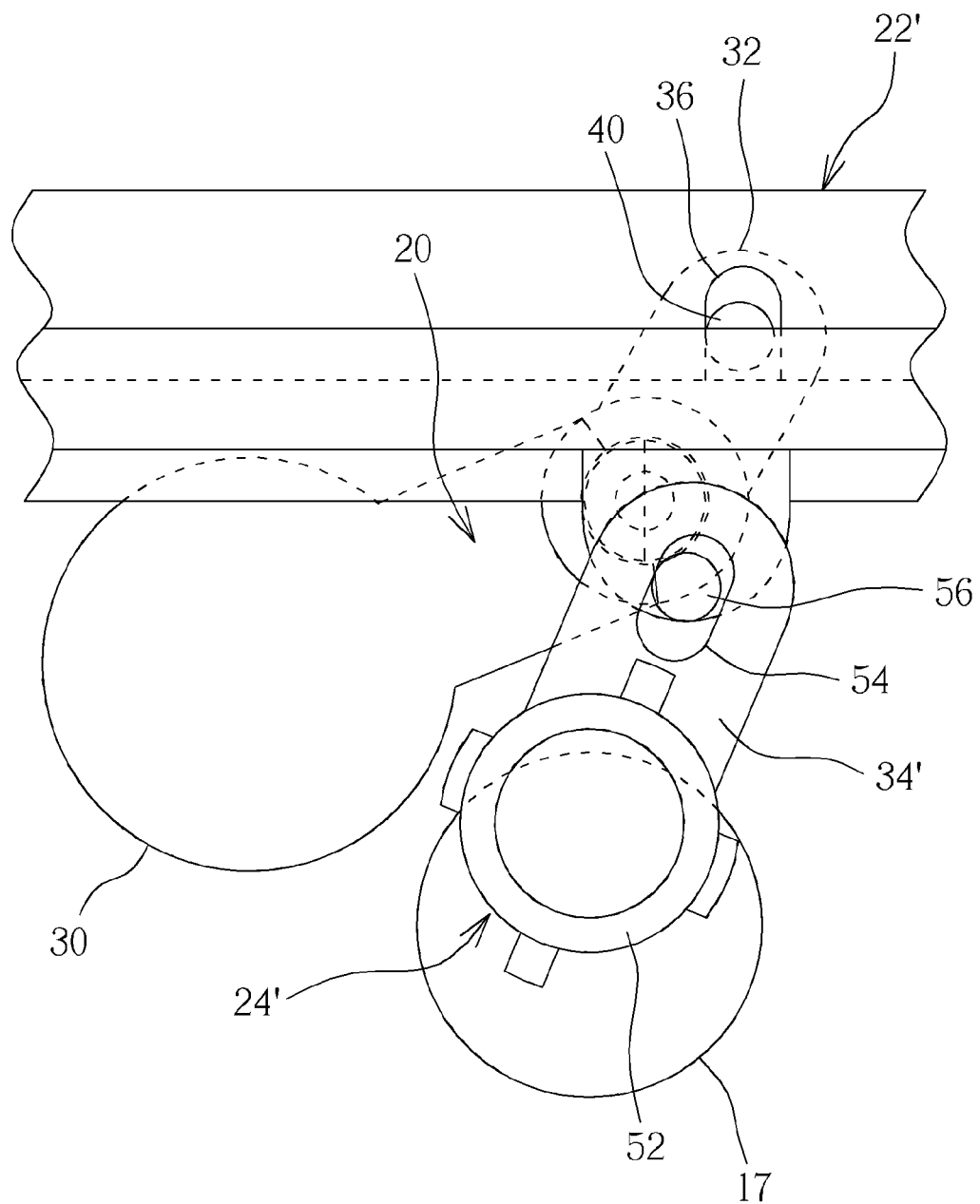
FIG. 9 is an enlarged diagram of the rod in FIG. 8 rotating to make the covering portion not cover the opening.

It should be mentioned that the cover mechanism of the present invention could only utilize the rotating member to drive the driving handle without the push button. For example, the related design could be as shown in FIG. 7, FIG. 8, and FIG. 9. FIG. 7 is a partial sectional diagram of a portable electronic device 10' according to a second embodiment of the present invention. FIG. 8 is an enlarged diagram of the rod 20 in FIG. 7 rotating to make the covering portion 30 cover the opening 17. FIG. 9 is an enlarged diagram of the rod 20 in FIG. 8 rotating to make the covering portion 30 not cover the opening 17. Components both mentioned in the first embodiment and the second embodiment represent components with similar functions or structures, and the related description is omitted herein. As shown in FIG. 7, FIG. 8, and FIG. 9, the portable electronic device 10' includes the main body 12 (not shown in the figures), the cover 14, the bezel 16, and a cover mechanism 18'. The cover mechanism 18' includes the rod 20, a driving handle 22', a rotating member 24', and the spring 28 (not shown in the figures). The rotating member 24' could have a second linkage portion 34' and a rotating button portion 52. The rotating button portion 52 rotatably protrudes from the cover 14. A slot portion 54 could be formed on the second linkage portion 34'. A protruding pillar 56 extends from the driving handle 22' toward the slot portion 54. The protruding pillar 56 could be movably disposed through the slot portion 54.

Similarly, the linkage design for the driving handle 22', the first linkage portion 32 of the rod 20, and the second linkage portion 34' of the rotating member 24' is not limited to the second embodiment, meaning that the present invention could also adopt other linkage design for driving the first linkage portion 32 via linkage between the second linkage portion 34' and the driving handle 22'. For example, the first linkage portion 32 and the second linkage portion 34' could have protruding pillars respectively corresponding to slot portions of the driving handle 22'. The protruding pillars of the first linkage portion 32 and the second linkage portion 34' are movably disposed through the slot portions of the driving handle 22' respectively, so that the second linkage portion 34' could drive the driving handle 22' to move with rotation of the rotating member 24' and the first linkage portion 32 could move with the driving handle 22'.

In such a manner, via the aforesaid design, when the user wants to use the optical device 13 of the portable electronic device 10', the user just needs to rotate the rotating button portion 52 to make the rotating member 24' rotate from a position as shown in FIG. 8 to a position as shown in FIG. 9. During the aforesaid process, via linkage between the slot portion 54 and the protruding pillar 56, the rotating member 24' could push the driving handle 22' via the first linkage portion 32 to move from a position as shown in FIG. 8 to a position as shown in FIG. 9. At the same time, via linkage between the protruding pillar 40 of the rod 20 and the slot portion 36 of the driving handle 22', the driving handle 22' could drive the rod 20 via the first linkage portion 32 to rotate, so as to make the covering portion 30 move from a covering position covering the opening 17 as shown in FIG. 8 to an open position not covering the opening 17 as shown in FIG. 9. Accordingly, the related operations (e.g. an image projection operation or an image capturing operation) of the optical device 13 could be performed. As for other related description for the portable electronic device 10', it could be reasoned by analogy according to the first embodiment and omitted herein.

Furthermore, the spring 28 is an omissible component for simplifying the mechanical design of the cover mechanism 18'. To be brief, in another embodiment in which the spring 28 is omitted, when the user does not need to use the optical device 13, the user just needs to manually rotate the rotating button portion 52 to make the rotating member 24' rotate from the position as shown in FIG. 9 back to the position as shown in FIG. 8, so as to drive the driving handle 22' via linkage between the protruding pillar 56 and the slot portion 54 to move from the position as shown in FIG. 9 back to the position as shown in FIG. 8. During the aforesaid process, via linkage between the protruding pillar 40 and the slot portion 36, the driving handle 22' could drive the rod 20 to rotate, so as to make the covering portion 30 move from the open position as shown in FIG. 9 back to the covering position as shown in FIG. 8 for hiding the optical device 13.

Similarly, the spring 28 of the cover mechanism 18 could also be an omissible component. For example, in another embodiment in which the spring 28 is omitted, the push button 26 could further have a protruding portion formed thereon opposite to the protruding portion 46 to abut against the other side of the abutting portion 44. Accordingly, when the user pushes the push button 26 to return its original position, the aforesaid protruding portion could push the abutting portion 44 to make the rotating member 24 rotate with movement of the push button 26, so as to drive the driving handle 22 to move back to the covering position for achieving the purpose that the driving handle 22 could return its original position.

Compared with the prior art, the present invention adopts the design in which the rotating member is disposed between the bezel and the cover to rotatably drive the driving handle to move relative to the bezel for rotating the rod to make the covering portion selectively cover the opening with rotation of the rod. Accordingly, the portable electronic device of the present invention could selectively hide the optical device based on the user's needs. In such a manner, since the cover mechanism of the present invention adopts the design of disposing the rotating member between the bezel and the cover to replace the prior art design of disposing the covering sheet on the front side of the bezel, the present invention could efficiently solve the prior art problem that disposal of the covering sheet could spoil the structural integrity of the bezel and the user could view the push button of the covering sheet when operating the portable electronic device, so as to improve flexibility of the portable electronic device in designating the bezel and enhance the user experience for the outer appearance of the portable electronic device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A portable electronic device comprising:
   a main body having at least one optical device;
   a cover covering the main body;
   a bezel having at least one opening for exposing the at least one optical device, the bezel being connected to the cover for containing the main body cooperatively with the cover; and
   a cover mechanism comprising:
      at least one rod having a covering portion and a first linkage portion, the at least one rod being pivoted to the bezel for making the covering portion movable between a covering position and an open position relative to the bezel;
      a driving handle movably disposed on the bezel, the first linkage portion being movably connected to the driving handle; and
      a rotating member rotatably disposed between the bezel and the cover and having a second linkage portion, the second linkage portion being movably connected to the driving handle;
   wherein when the rotating member rotates, the second linkage portion drives the driving handle to drive the at least one rod to rotate via the first linkage portion, so as to make the covering portion move to the covering position with rotation of the at least one rod to cover the at least one opening, or move to the open position with rotation of the at least one rod to not cover the at least one opening.

2. The portable electronic device of claim 1, wherein a slot portion is formed on the driving handle, a protruding pillar extends from the first linkage portion toward the slot portion, and the protruding pillar is movably disposed through the slot portion to make the first linkage portion move with the driving handle.

3. The portable electronic device of claim 1, wherein a slot portion is formed on the driving handle, a protruding pillar extends from the second linkage portion toward the slot portion, and the protruding pillar is movably disposed through the slot portion to make the second linkage portion drive the driving handle to move with rotation of the rotating member.

4. The portable electronic device of claim 1, wherein the rotating member further has an abutting portion, and the cover mechanism further comprises:
   a push button slidably disposed on the cover and having at least one protruding portion formed thereon toward the abutting portion, the protruding portion abutting against the abutting portion, the protruding portion pushing the abutting portion to make the rotating member rotate with movement of the push button when the push button slides on the cover.

5. The portable electronic device of claim 4, wherein the cover has an inclined top surface portion and a casing portion, the inclined top surface portion is connected to the casing portion for covering the main body cooperatively with the casing portion, and the push button is slidably disposed on the inclined top surface portion.

6. The portable electronic device of claim 5, wherein a plurality of heat dissipating holes is formed on the inclined top surface portion.

7. The portable electronic device of claim 1, wherein the cover mechanism further comprises:
   a spring connected to the bezel and the driving handle respectively for providing elastic force to drive the driving handle to move relative to the bezel, so as to make the driving handle rotate the at least one rod for driving the covering portion move to the covering position with rotation of the at least one rod to cover the at least one opening.

8. The portable electronic device of claim 1, wherein the rotating member further has a rotating button portion, and the rotating button portion rotatably protrudes from the cover to make the rotating member rotatable relative to the cover.

9. The portable electronic device of claim 8, wherein a slot portion is formed on the second linkage portion, a protruding pillar extends from the driving handle toward the slot portion, and the protruding pillar is movably disposed through the slot portion to make the second linkage portion drive the driving handle to move with rotation of the rotating button portion.

10. The portable electronic device of claim 1, wherein the optical device is an image processing device.

11. The portable electronic device of claim 1, wherein the at least one rod is in a bent shape.

12. A cover mechanism for selectively covering at least one opening of a portable electronic device, the portable electronic device comprising a cover, a bezel, and at least one optical device, the bezel having the at least one opening for exposing the at least one optical device, the bezel being connected to the cover and containing the at least one optical device, the cover mechanism comprising:
   at least one rod having a covering portion and a first linkage portion, the at least one rod being pivoted to the bezel for making the covering portion movable between a covering position and an open position relative to the bezel;
   a driving handle movably disposed on the bezel, the first linkage portion being movably connected to the driving handle; and
   a rotating member rotatably disposed between the bezel and the cover and having a second linkage portion, the second linkage portion being movably connected to the driving handle;
   wherein when the rotating member rotates, the second linkage portion drives the driving handle to drive the at least one rod to rotate via the first linkage portion, so as to make the covering portion move to the covering position with rotation of the at least one rod to cover the at least one opening, or move to the open position with rotation of the at least one rod to not cover the at least one opening.

13. The cover mechanism of claim 12, wherein a slot portion is formed on the driving handle, a protruding pillar extends from the first linkage portion toward the slot portion, and the protruding pillar is movably disposed through the slot portion to make the first linkage portion move with the driving handle.

14. The cover mechanism of claim 12, wherein a slot portion is formed on the driving handle, a protruding pillar extends from the second linkage portion toward the slot portion, and the protruding pillar is movably disposed through the slot portion to make the second linkage portion drive the driving handle to move with rotation of the rotating member.

15. The cover mechanism of claim 12, wherein the rotating member further has an abutting portion, and the cover mechanism further comprises:
   a push button slidably disposed on the cover and having at least one protruding portion formed thereon toward the abutting portion, the protruding portion abutting against the abutting portion, the protruding portion pushing the abutting portion to make the rotating member rotate with movement of the push button when the push button slides on the cover.

16. The cover mechanism of claim 15, wherein the cover has an inclined top surface portion and a casing portion, the inclined top surface portion is connected to the casing portion for covering the main body cooperatively with the casing portion, and the push button is slidably disposed on the inclined top surface portion.

17. The cover mechanism of claim 12, wherein the cover mechanism further comprises:
   a spring connected to the bezel and the driving handle respectively for providing elastic force to drive the driving handle to move relative to the bezel, so as to make the driving handle rotate the at least one rod for driving the covering portion move to the covering position with rotation of the at least one rod to cover the at least one opening.

18. The cover mechanism of claim 12, wherein the rotating member further has a rotating button portion, and the rotating button portion rotatably protrudes from the cover to make the rotating member rotatable relative to the cover.

19. The cover mechanism of claim 17, wherein a slot portion is formed on the second linkage portion, a protruding pillar extends from the driving handle toward the slot portion, and the protruding pillar is movably disposed through the slot portion to make the second linkage portion drive the driving handle to move with rotation of the rotating button portion.

20. The cover mechanism of claim 12, wherein the at least one rod is in a bent shape.

\* \* \* \* \*